United States Patent [19]

Breyta et al.

[11] Patent Number: 5,625,020
[45] Date of Patent: Apr. 29, 1997

[54] PHOTORESIST COMPOSITION

[75] Inventors: Gregory Breyta, San Jose, Calif.; Christopher J. Knors, Bound Brook, N.J.; Hiroshi Ito, San Jose, Calif.; Ratnam Sooriyakumaran, East Fishkill, N.Y.

[73] Assignee: International Business Machines Corporation, Armonk, N.Y.

[21] Appl. No.: 571,571

[22] Filed: Dec. 13, 1995

Related U.S. Application Data

[62] Division of Ser. No. 241,931, May 11, 1994, Pat. No. 5,492,793, which is a continuation of Ser. No. 970,745, Nov. 3, 1992, abandoned.

[51] Int. Cl.$^6$ ..................................................... C08F 220/12
[52] U.S. Cl. .................. 526/329.2; 526/328; 430/270.1
[58] Field of Search ............................. 526/329.2, 328; 430/270.1

[56] References Cited

U.S. PATENT DOCUMENTS

| | | | |
|---|---|---|---|
| 4,491,628 | 1/1985 | Ito et al. | 430/176 |
| 4,678,843 | 7/1987 | Elmore et al. | 525/378 |
| 4,898,916 | 2/1990 | Gupta | 525/344 |
| 4,912,173 | 3/1990 | Keene et al. | 525/378 |
| 4,931,379 | 6/1990 | Brunsvold et al. | 430/270 |
| 4,962,147 | 10/1990 | Vicari | 524/460 |

FOREIGN PATENT DOCUMENTS

| | | |
|---|---|---|
| 0314488A2 | 10/1988 | European Pat. Off. |
| 0343986A2 | 5/1989 | European Pat. Off. |
| 0353898A1 | 7/1989 | European Pat. Off. |
| 0489550A1 | 11/1991 | European Pat. Off. |

OTHER PUBLICATIONS

M. Khojasteh et al., "Synthesis of Deep UV Grade Polyhydroxystyrene", IBM Technical Disclosure Bulletin, vol. 33, No. 5, Oct. 1990.

E. Scriven, "4–Dialkylaminopyridines: Super Acylation and Alkylation Catalysts", Chemical Society Reviews, vol. 11, 1982.

W. Hinsberg et al., "A Radiotracer Study of N–Methylpyrollidone Uptake by Polymeric Films", RJ 7635 (71082) Aug. 14, 1990.

*Primary Examiner*—Mark Chapman
*Attorney, Agent, or Firm*—Robert B. Martin

[57] ABSTRACT

The present invention relates to an improved chemically amplified photoresist composition comprising (i) a photosensitive acid generator and (ii) a polymer comprising the reaction product of hydroxystyrene with acrylate, methacrylate or a mixture of acrylate and methacrylate.

2 Claims, 2 Drawing Sheets

PHOTORESIST COMPOSITION

This is a divisional of application Ser. No. 08/241,931, filed on May 11, 1994 now U.S. Pat. No. 5,492,793 which was a continuation of Ser. No. 07/970,745 filed on Nov. 3, 1992, now abandoned.

FIELD OF THE INVENTION

The present invention relates to an improved lithographic photoresist composition for use in the manufacture of integrated circuits.

BACKGROUND OF THE INVENTION

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g. deep UV e.g. 190 to 315 nm) than the currently employed mid-UV spectral range (e.g. 350 nm to 450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al., "An Overview of Resist Processing for Deep-UV Lithography", J. Photopolym Sci. Technol. 4, 299 (1991). The resist compositions generally comprise a photosensitive acid generator and an acid sensitive polymer. The polymer has acid sensitive side chain (pendant) groups which are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in nonpolar organic solvents such as anisole. Thus the resist can produce positive or negative images of the mask depending of the selection of the developer solvent.

Although chemically amplified resist compositions generally have suitable lithographic sensitivity, in certain applications, their performance can be improved by (i) increasing their thermal stability in terms of thermal decomposition and plastic flow and (ii) increasing their stability in the presence of airborne chemical contaminants. For example, in some semiconductor manufacturing processes, post image development temperatures (e.g. etching, implantation etc.) can reach 200° C. Brunsvold et al., U.S. Pat. Nos. 4,939,070 (issued Jul. 3, 1990) and 4,931,379 (issued Jun. 5, 1990) disclose chemically amplified, acid sensitive resist compositions having increased thermal stability in the post-image development stage. Brunsvold's resist compositions form a hydrogen bonding network after cleavage of the acid sensitive side chain group to increase the thermal stability of the polymer. Brunsvold avoids hydrogen bonding moieties prior to the cleavage reaction because such hydrogen bonding is known to unacceptably thermally destabilize the acid sensitive side chain. Although Brunsvold resists have suitable thermal stability, they also have lower sensitivity and therefore are unsuitable in certain applications.

With respect to chemical contamination, MacDonald et al. SPIE 1466 2, (1991) reported that due to the catalytic nature of the imaging mechanisms, chemically amplified resist systems are sensitive toward minute amounts of airborne chemical contaminants such as basic organic substances. These substances degrade the resulting developed image in the film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes.

Therefore, there still is a need in the art for an acid sensitive, chemically amplified photoresist composition having high thermal stability and stability in the presence of airborne chemical contaminants for use in semiconductor manufacturing.

It is therefore an object of the present invention to provide an improved acid sensitive, chemically amplified photoresist composition.

Other objects and advantages will become apparent from the following disclosure.

SUMMARY OF THE INVENTION

The present invention relates to a photosensitive resist composition comprising (i) a photosensitive acid generator and (ii) a polymer comprising hydroxystyrene and acrylate, methacrylate or a mixture of acrylate and methacrylate. The resist has high lithographic sensitivity and high thermal stability. The resist also exhibits surprising stability in the presence of airborne chemical contaminants. The present invention also relates to the process for making the polymer in the resist composition. The photoresist composition of the present invention is useful in semiconductor manufacturing to make integrated circuit chips.

A more thorough disclosure of the present invention is presented in the detailed description which follows and from the accompanying drawing in which FIG. 1 and FIG. 2 are scanning electron micrographs of the developed resist of the present invention.

DETAILED DESCRIPTION OF THE INVENTION

Figure 1:
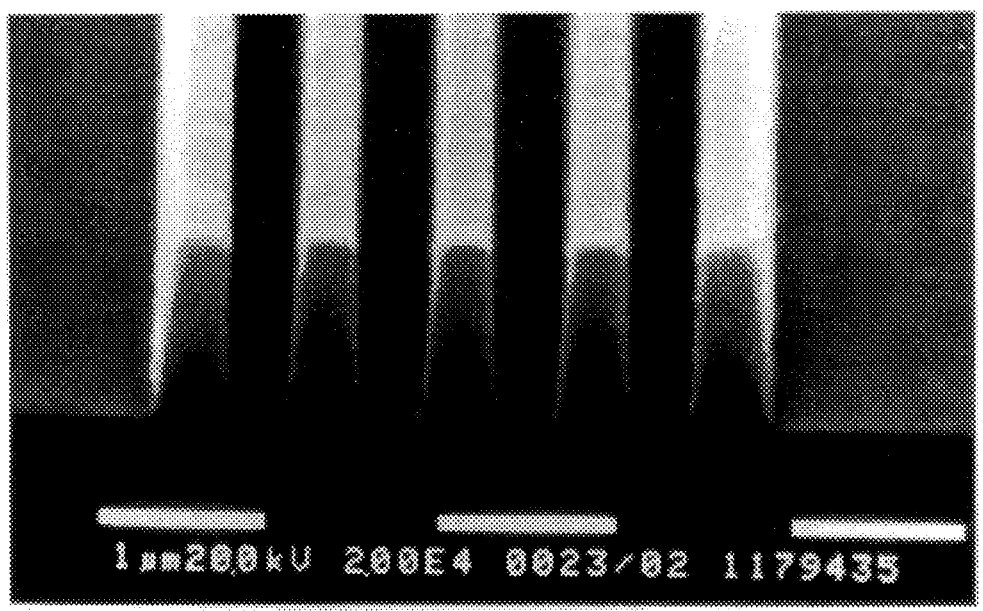

The present invention relates to a chemically amplified, photosensitive resist composition comprising (i) a photosensitive acid generator and (ii) a polymer comprising hydroxystyrene and acrylate, methacrylate or a mixture of acrylate and methacrylate.

The hydroxystyrene monomer or oligomer component of the polymer provides base solubility to the polymer in the resist composition. The hydroxystyrene is suitably the para or meta isomer (preferably para) and can be substituted with various substituents which do not interfere with the lithographic utility of the polymer such as halogens, methoxy, or lower alkyl (e.g. methyl or ethyl). The α-methyl hydroxystyrene can also be used in the polymer of the present invention.

The acrylate or methacrylate monomer or oligomer component of the polymer provides acid sensitivity to the polymer. The ester group of the acrylate or the methacrylate is an acid labile group which inhibits the dissolution of the polymer in alkaline developer or polar solvent. Upon imagewise exposure to radiation, the photogenerated acid cleaves the ester group and it is converted from dissolution inhibiting ester to a base soluble organic acid functionality thereby enabling image development of the composition. The acrylate or methacrylate can be provided with a variety of alkyl or aryl ester substituents. Suitable ester substituents are t-butyl and α-methylbenzyl.

The copolymer used in the process of the present invention can be prepared by standard radical copolymerization to yield random copolymers. For example, t-butyl methacrylate can be copolymerized with (i) p-tert-butoxycarbonyloxystyrene (a hydroxystyrene precursor monomer) with subsequent thermal cleavage or mild acidolysis of the t-butoxycarbonyl group to form p-hydroxystyrene/t-butyl methacrylate copolymer or (ii) with p-t-butyl(dimethyl)silyloxystyrene with subsequent desilylation with fluoride. Alternatively and preferably, acetoxystyrene is copolymerized with acrylate or methacrylate. Generally acetoxystyrene is mixed under nitrogen at an elevated temperature of about 50° to 100° C. with the ester monomer in a suitable solvent such as toluene or THF, along with a small amount of a free radical catalyst such as benzoyl peroxide. The product polymer poly (acetoxystyrene-co-acrylate) is then deacylated with mild base (e.g. dimethylaminopyridine, ammonium hydroxide, carbonate or bicarbonate) in a nonaqueous solvent such as an alcohol solvent (methanol or propanol) to form the hydroxystyrene/acrylate copolymer. Alternatively, the hydroxystyrene/acrylate or methacrylate copolymer can be a block copolymer.

Preferably, the copolymer contains the hydroxystyrene unit in the range of 50 to 90 mol% depending on the desired dissolution rate/sensitivity. The copolymer suitably has a number-average molecular weight (relative to polystyrene standard) ranging from 7,000 to 50,000. The copolymer has a high glass transition temperature of about 140° C. to about 170° C. The copolymer also has a high acid sensitivity. The acid labile ester groups of the copolymer are surprising thermally stable in the presence of the phenolic hydroxy groups up to a temperature of about 180° C. This enables a high pre-exposure heating of a film of the composition which results in substantially improved lithographic performance.

A variety of photosensitive acid generators can be used in the composition of the present invention. Generally, suitable generators will have a high thermal stablity (e.g. to temperature>160°) so they are not degraded during the pre-exposure processing. Suitable photosensitive acid generators for use in the present invention include triaryl sulfonium hexafluoroantimonate, diaryliodonium metal halides, and certain non-ionic acid generators such as tris (sulfonate) of pyrogallol, and N-sulfonyloxynaphthalimides.

Preferred are triphenylsulfonium triflate and

N-sulfonyloxynaphthalimide generators such as

N-camphorsulfonyloxynaphthalimide or

N-pentafluorobenzenesulfonyloxnaphthalimide.

The composition of the present invention is readily used in standard lithographic imaging processes. Generally, the first step of such process involves coating the substrate with a film comprising the polymer and a photosensitive acid generator both dissolved in a suitable solvent. Suitable substrates are comprised of silicon, ceramics, polymer or the like. Suitable organic casting solvents include ethyl cellosolve acetate, cyclohexanone, propylene glycol monomethyl ether acetate, and the like. The film will generally comprise about 80 to about 99.5 weight % of the polymer and about 0.5 to about 20 weight % of the photoacid generator both dissolved in the organic solvent. Optionally, the film can contain additives such as polymers and small molecules to adjust the films dissolution rate (e.g. polyhydroxystyrene), etch resistance, optical density, radiation sensitivity, adhesion and the like. The film can be coated on the substrate using art known techniques such as spin or spray coating, doctor blading or electrodeposition.

Generally, prior to exposure of the film, the film is heated to a low temperature to remove solvent. However, due to the unique thermal stability of polymer, including the thermal stability of the acid labile ester groups, the film of the present invention can be heated to a higher temperature in the pre-exposure heating step. Preferably, the film is heated to a temperature which is high enough to be at least about 20 centigrade degrees below the glass transition temperature of the polymer, more preferably to a temperature which is at or above the glass transition temperature (Tg) of the polymer and below the acid labile ester thermal cleavage temperature for a short time of at least about 10 to 15 seconds (preferably a minimum of about 30 seconds) to about 15 minutes. This high temperature pre-exposure heating step surprisingly functions to protect the film and the undeveloped image formed in the film from degradation due to airborne chemical contaminants during the extended and variable pre-and post-exposure period prior to the development of the image in the film.

The glass transition temperature (Tg) of the polymer can be readily determined by art known procedures such as a differential scanning calorimetry or dynamic mechanical analysis. The thermal cleavage temperature of the acid-labile group of the polymer can be determined by thermogravimetric analysis involves heating the material at a constant rate and recording weight loss. IR spectroscopy involves heating several samples and then analyzing the IR spectra of the samples to determine the extent of thermal cleavage of the acid labile group. Dissolution analysis involves heating several films at various temperatures and then determining reduction in film thickness after development.

Generally, after pre-exposure baking, the film is imagewise exposed to radiation suitably electron beam or electromagnetic, preferably electromagnetic radiation such as ultraviolet or x-ray preferably deep ultraviolet radiation, preferably at a wavelength of about 190 to 315 nm, most preferably at 248 nm. Suitable radiation sources include mercury, mercury/xenon, eximer laser, xenon lamps, electron beam or x-ray. Generally the exposure dose is less than 100 millijoule/cm$^2$, preferably less than 50 millijoule/cm$^2$. Generally, the exposure of the film is at ambient temperature. In the exposed areas of the film, photosensitive acid generator produces free acid. Because the radiation dose is so low, there is essentially negligible radiation induced cleavage of the ester groups and negligible radiation induced main chain scission decomposition of the polymer. The free acid causes acid catalyzed cleavage of the ester groups of the polymer in the exposed area. The cleavage of the ester groups alters the dissolution rate of the polymer and the differential solubility between the exposed and unexposed areas of the film enables aqueous base development of the image in the film.

After the film has been exposed to radiation, it is heated again to an elevated temperature preferably above about 110° to about 160° C. and more preferably about 130° to about 160° C. for a short period of time of about 30 to 300 seconds. The elevated temperature functions in part to enhance the acid catalyzed cleavage of the ester pendant groups. However, this high temperature post exposure baking also surprisingly substantially improves the contrast and resolution of the developed images in the photoresist composition of the present invention.

The last step of the process of the present invention involves development of the image in the film. Suitable development techniques are known to those skilled in the art. Preferably, the image is solvent developed preferably in an aqueous base solvent for environmental improvement, preferably a solvent without metal ions such as tetraalkyl ammonium hydroxide. The image in the film has high resolution and straight side walls without defects caused by airborne chemical contaminants. Further, the film has a high Tg for thermal stability in subsequent processing. Also the film has high dry etch resistance for subsequent device fabrication.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Synthesis of Poly(4-acetoxystyrene-co-t-butylmethacrylate) (80:20):

25.90 grams (0.16 mole) of 4-acetoxystyrene, 5.70 grams (0.04mole) of t-butylmethacrylate and 32 grams of dry THF were placed in a round bottom flask equipped with a magnetic stirring bar and a reflux condenser. 1.25 grams of benzoyl peroxide was added to this mixture and the flask was evacuated and purged with nitrogen (4×) with the aid of a firestone valve. The contents were stirred and heated at 65 C (oil bath), under nitrogen, for 54 hours. Afterwards, the viscous mixture was allowed to cool to room temperature, diluted with 150 ml THF and added dropwise into 2 liters of DI water with-stirring. The precipitated polymer was filtered (frit) and dried under vacuum at 60° C. Yield was 30.68 grams.

EXAMPLE 2

Synthesis of Poly(4-hydroxystyrene-co-t-butylmethacrylate) (80:20):

20 grams of Poly(4-acetoxystyrene-co-t-butylmethacrylate) and 200 ml methanol were placed in a round bottom flask equipped with magnetic stirring bar, reflux condenser and nitrogen inlet. 2 grams (0.016 mole) of 4-dimethylaminopyridine was added to this suspension and the contents were heated to reflux, with stirring, for 17 hours. The IR spectrum of the product (thin film on NaCl plate) indicated that the reaction was complete by this time. The contents were allowed to cool to room temperature, 2.16 grams (0.036 moles) of glacial acetic acid in 5 ml methanol was added and stirred for 30 minutes. Afterwards, the solution was added dropwise into 2 liters of DI water and the polymer was filtered and dried under vacuum. This polymer was redissolved in 150 ml acetone and reprecipitated from 1.5 liters of DI water. The polymer was filtered and dried under vacuum at 60° C. Yield: 13.11 grams.

EXAMPLE 3

Lithographic Performance

Copolymer of methacrylate with p-hydroxystyrene with a weight-average molecular weight of 36,100 containing 35 mole % of the t-butyl methacrylate unit was dissolved together with 4.75 wt % of triphenylsulfonium hexafluoroantimonate in propylene glycol monomethyl ether acetate. A film was pre-exposure-baked at 180° C. for 2 min., exposed on a Canon excimer 248 nm stopper laser post-exposure-baked at 130° C. for 1 rain, and developed with MF319 for 60 sec. In FIG. 1, there is shown a scanning electron micrograph of the film showing positive images with straight walls free of the T-top structure.

EXAMPLE 4

Lithographic Performance

Figure 2:
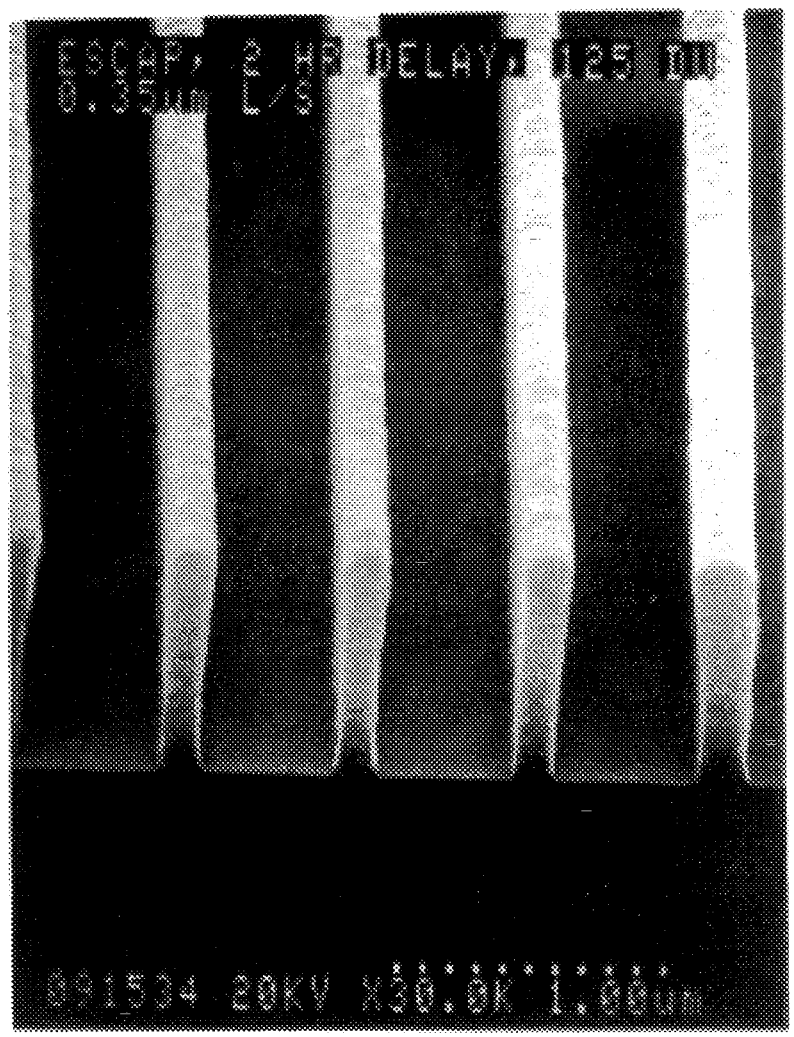

A copolymer of p-hydroxystyrene with t-butyl acrylate (65:35 composition, 34,600 weight-average molecular weight) was mixed with 2.5 wt % of N-camphorsulfonyloxynaphthalimide in propylene glycol monomethyl ether acetate. Spin-cast films were pre-exposure-baked at 150° C. for 2 rain, exposed, on a GCA KrF excimer laser stepper with 0.42 NA, allowed to stand for 2 hr., post-exposure-baked at 150° C. for 2 min., and developed with MF321 for 60 sec. In FIG. 2 is shown a scanning electron micrograph of the film showing positive images with 0.35 µm line/space arrays without any line width shift or image degradation due to exposure to airborne chemical contaminants.

Although this invention has been described with respect to specific embodiments, the details thereof are not to be constructed as limitations for it will be apparent that various embodiments, changes, and modifications may be resorted to without departing from the spirit and scope thereof, and it is understood that such equivalent embodiments are intended to be included within the scope of this invention.

We claim:

1. A process for making poly(hydroxystyrene-co-acrylate) comprising the steps of:
   (i) copolymerizing acetoxystyrene with acrylate to form a copolymer;
   (ii) deacylating the copolymer of (i) with a base in a nonaqueous solvent.

2. A process for making poly(hydroxystyrene-co-methacrylate) comprising the steps of:
   (i) copolymerizing acetoxystyrene with methacrylate to form a copolymer;
   (ii) deacylating the copolymer of (i) with a base in a nonaqueous solvent.

* * * * *